(12) United States Patent  
Nieh et al.

(10) Patent No.: US 9,099,495 B1
(45) Date of Patent: Aug. 4, 2015

(54) FORMATION OF HIGH QUALITY FIN IN 3D STRUCTURE BY WAY OF TWO-STEP IMPLANTATION

(71) Applicant: TAIWAN SEMICONDUCTOR MANUFACTURING COMPANY, LTD., Hsin-Chu (TW)

(72) Inventors: Chun-Feng Nieh, Hsinchu (TW); Hsin-Wei Wu, Hsinchu (TW); Tsun-Jen Chan, Pingzhen (TW); Yu-Chang Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/177,518

(22) Filed: Feb. 11, 2014

(51) Int. Cl.
| | | |
|---|---|---|
| *H01L 21/8238* | (2006.01) |
| *H01L 29/66* | (2006.01) |
| *H01L 21/02* | (2006.01) |
| *H01L 21/306* | (2006.01) |
| *H01L 29/167* | (2006.01) |
| *H01L 21/265* | (2006.01) |
| *H01L 21/324* | (2006.01) |

(52) U.S. Cl.
CPC .... *H01L 29/66803* (2013.01); *H01L 21/02532* (2013.01); *H01L 21/02576* (2013.01); *H01L 21/02609* (2013.01); *H01L 21/26513* (2013.01); *H01L 21/26586* (2013.01); *H01L 21/30604* (2013.01); *H01L 21/324* (2013.01); *H01L 29/167* (2013.01)

(58) Field of Classification Search
CPC .............. H01L 21/823431; H01L 21/823821; H01L 21/845; H01L 29/785; H01L 29/41791; H01L 29/66795; H01L 27/0886; H01L 27/0924; H01L 27/10826; H01L 27/10879; H01L 27/1211
See application file for complete search history.

(56) References Cited

U.S. PATENT DOCUMENTS

2011/0151652 A1*  6/2011  Sssaki et al. ................ 438/513

* cited by examiner

*Primary Examiner* — Hoai V Pham
(74) *Attorney, Agent, or Firm* — Haynes and Boone, LLP

(57) ABSTRACT

The present disclosure discloses a method of fabricating a semiconductor device. A fin structure is formed over a substrate. The fin structure contains a semiconductor material. A first implantation process is performed to a region of the fin structure to form a fin seed within the region of the fin structure. The fin seed has a crystal structure. The first implantation process is performed at a process temperature above about 100 degrees Celsius. A second implantation process is performed to the region of the fin structure to cause the region of the fin structure outside the fin seed to become amorphous. The second implantation process is performed at a process temperature below about 0 degrees Celsius. Thereafter, an annealing process is performed to recrystallize the region of the fin structure via the fin seed.

20 Claims, 13 Drawing Sheets

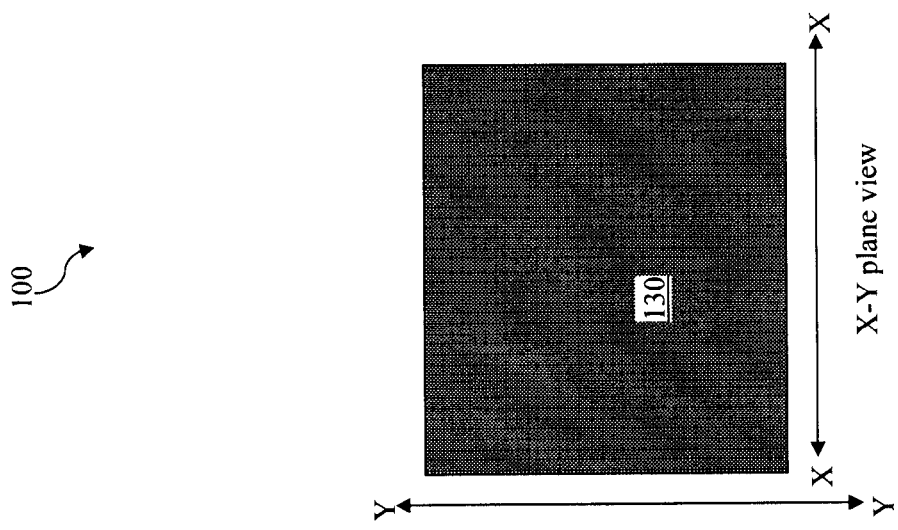
Fig. 3C X-Y plane view
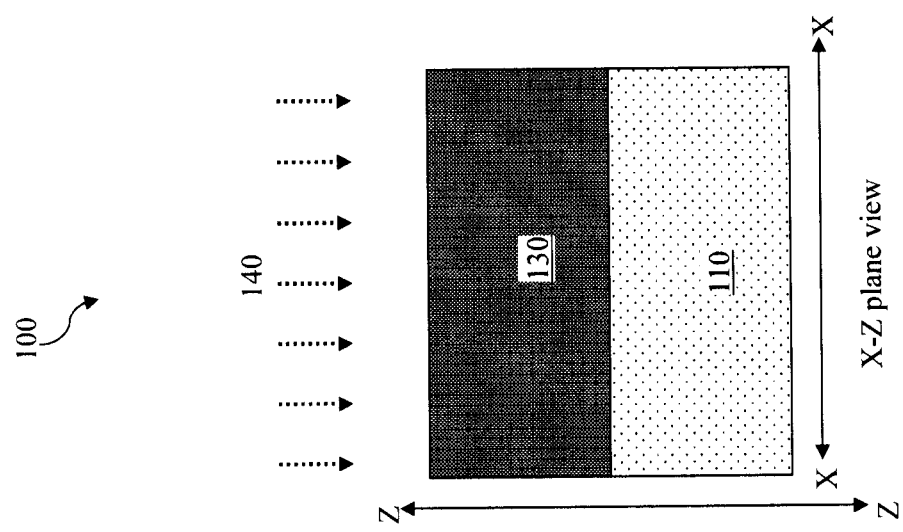
Fig. 3B X-Z plane view
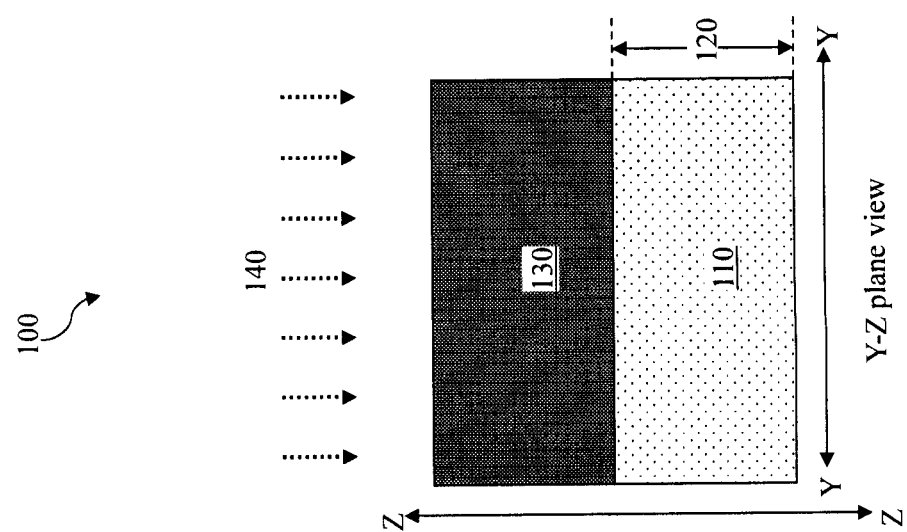
Fig. 3A Y-Z plane view

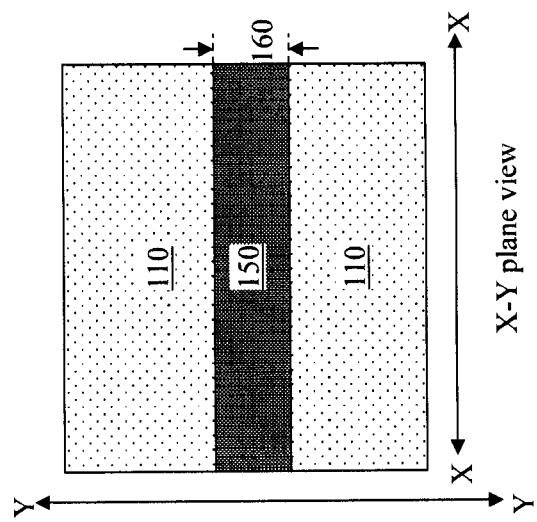
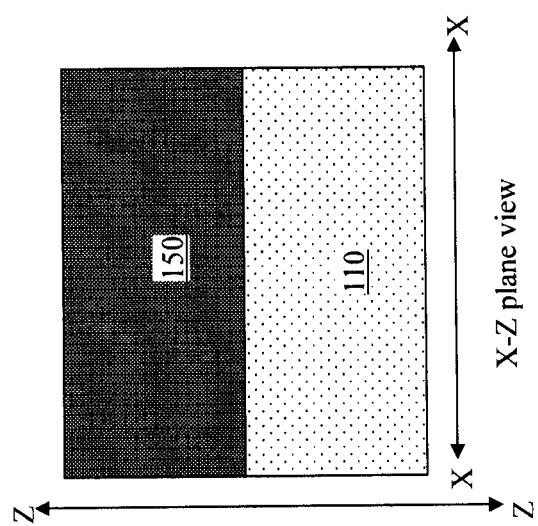
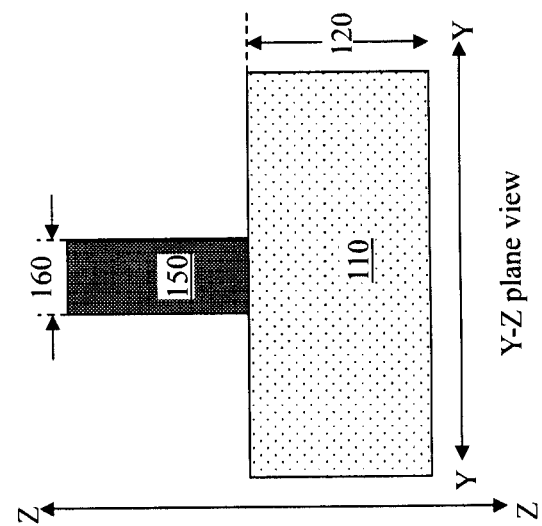
Fig. 4A Y-Z plane view
Fig. 4B X-Z plane view
Fig. 4C X-Y plane view

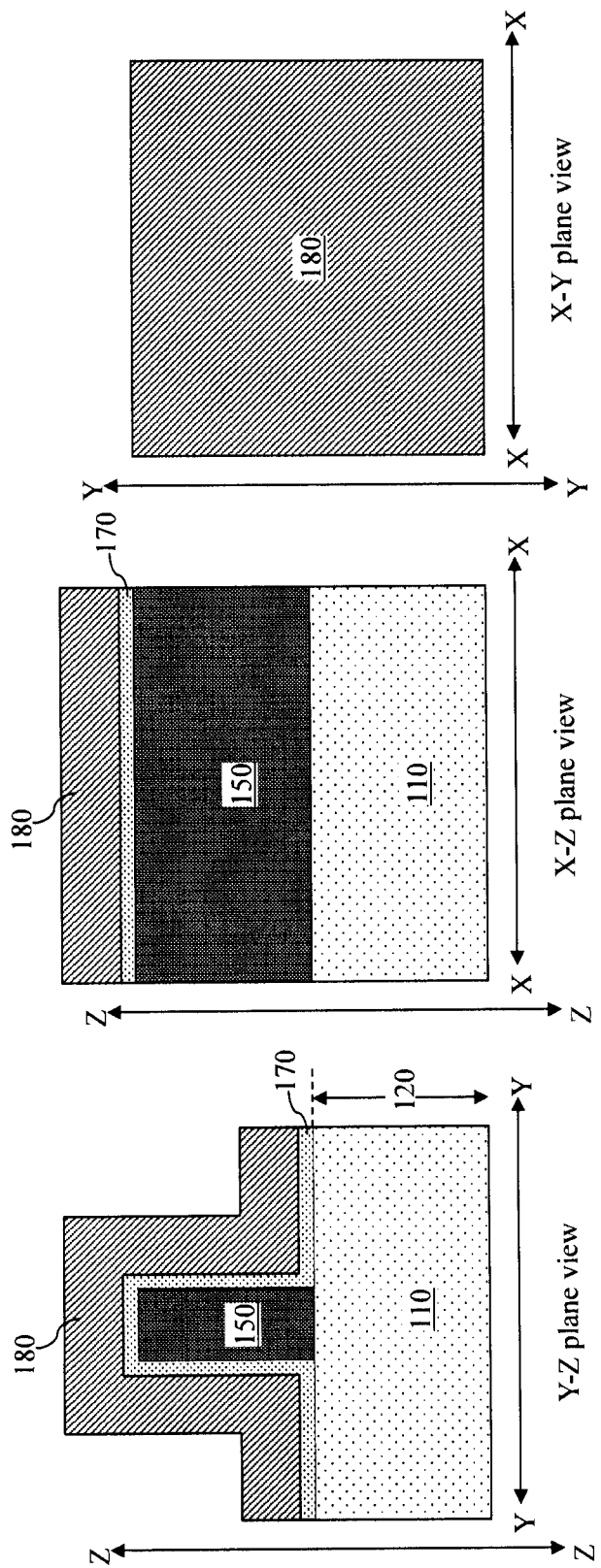

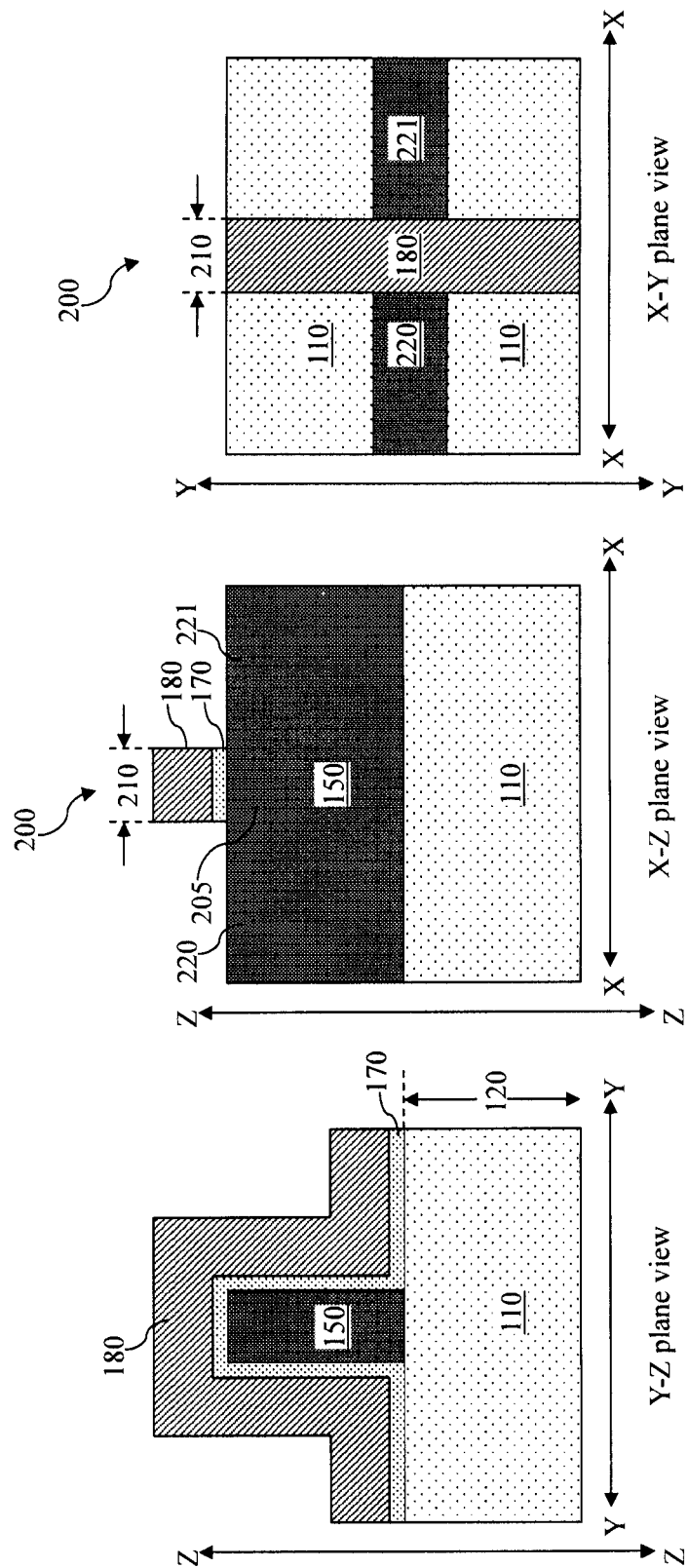

Y-Z plane view

Y-Z plane view

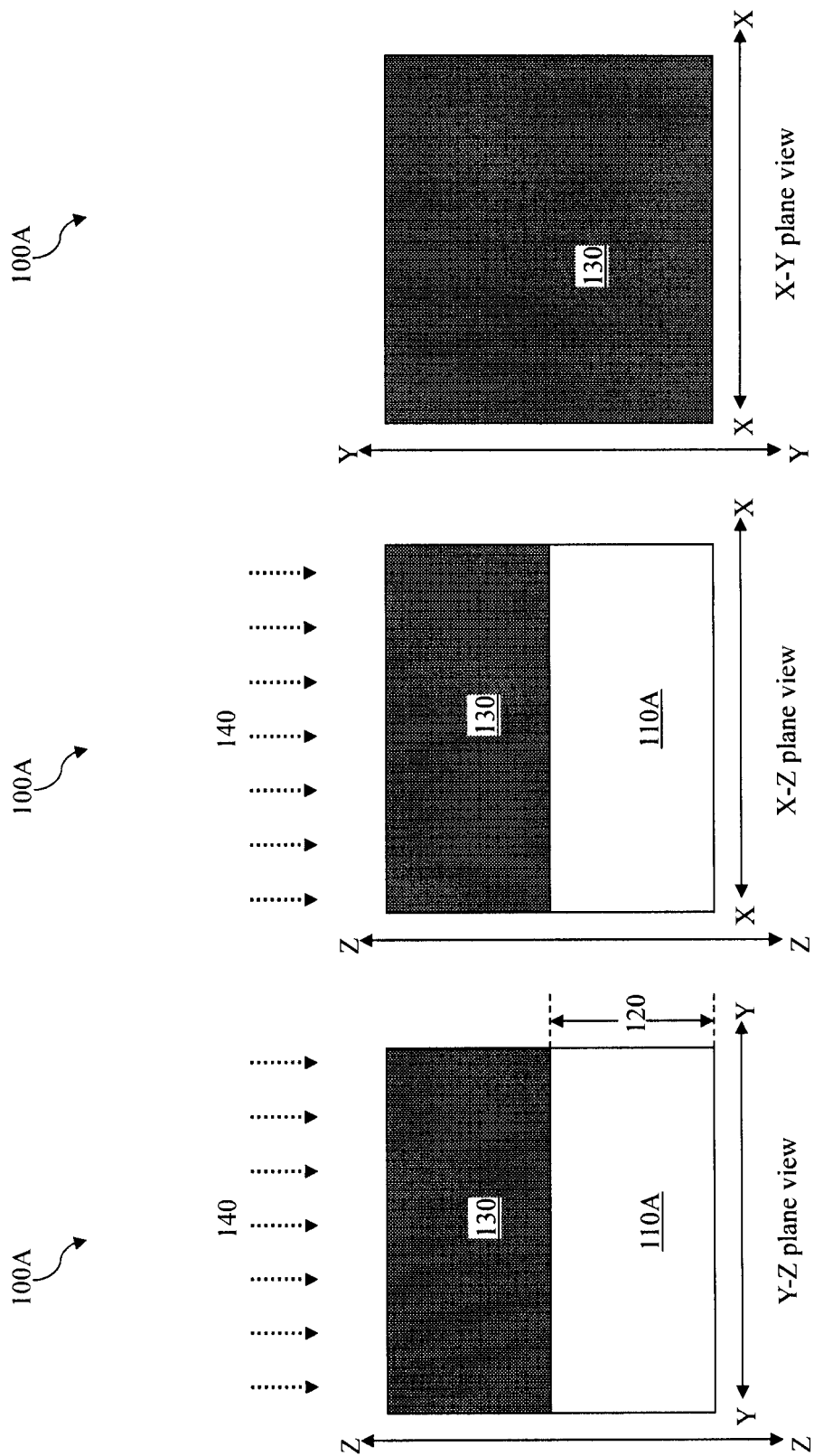

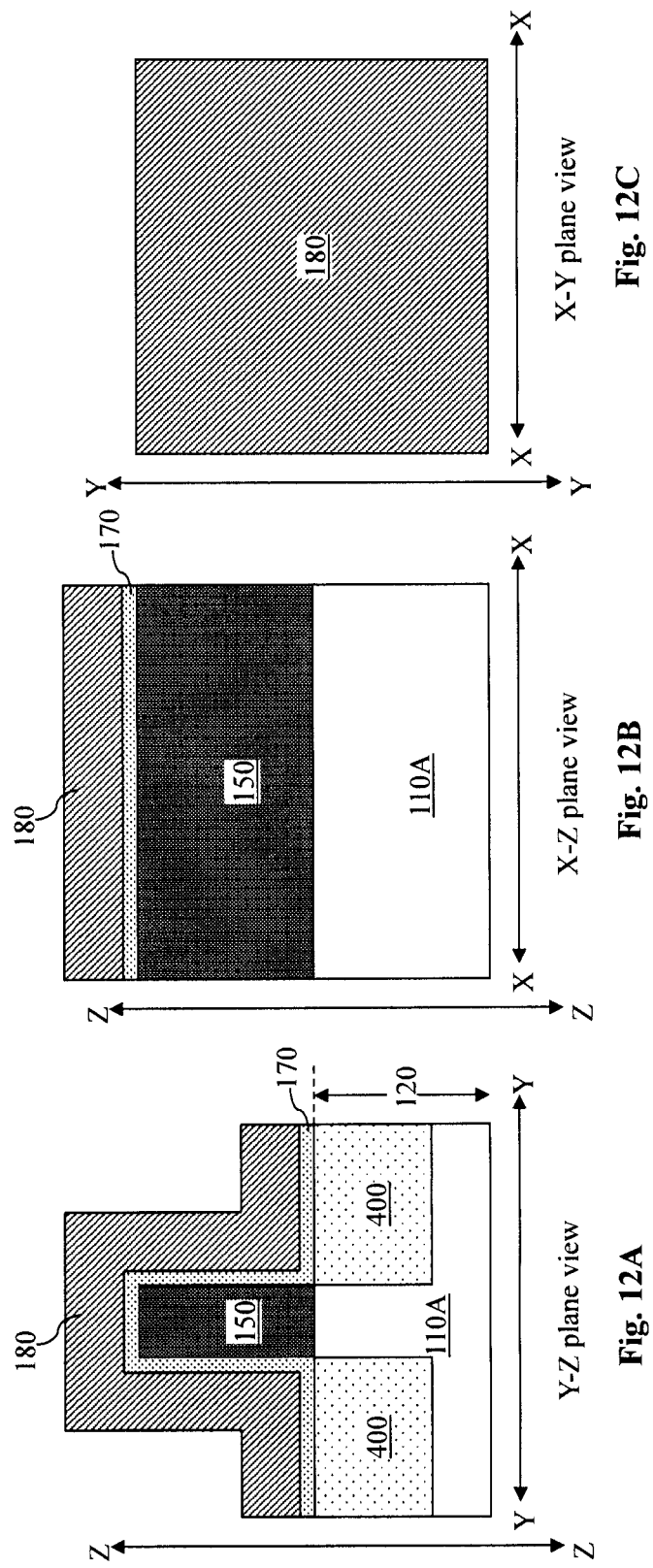

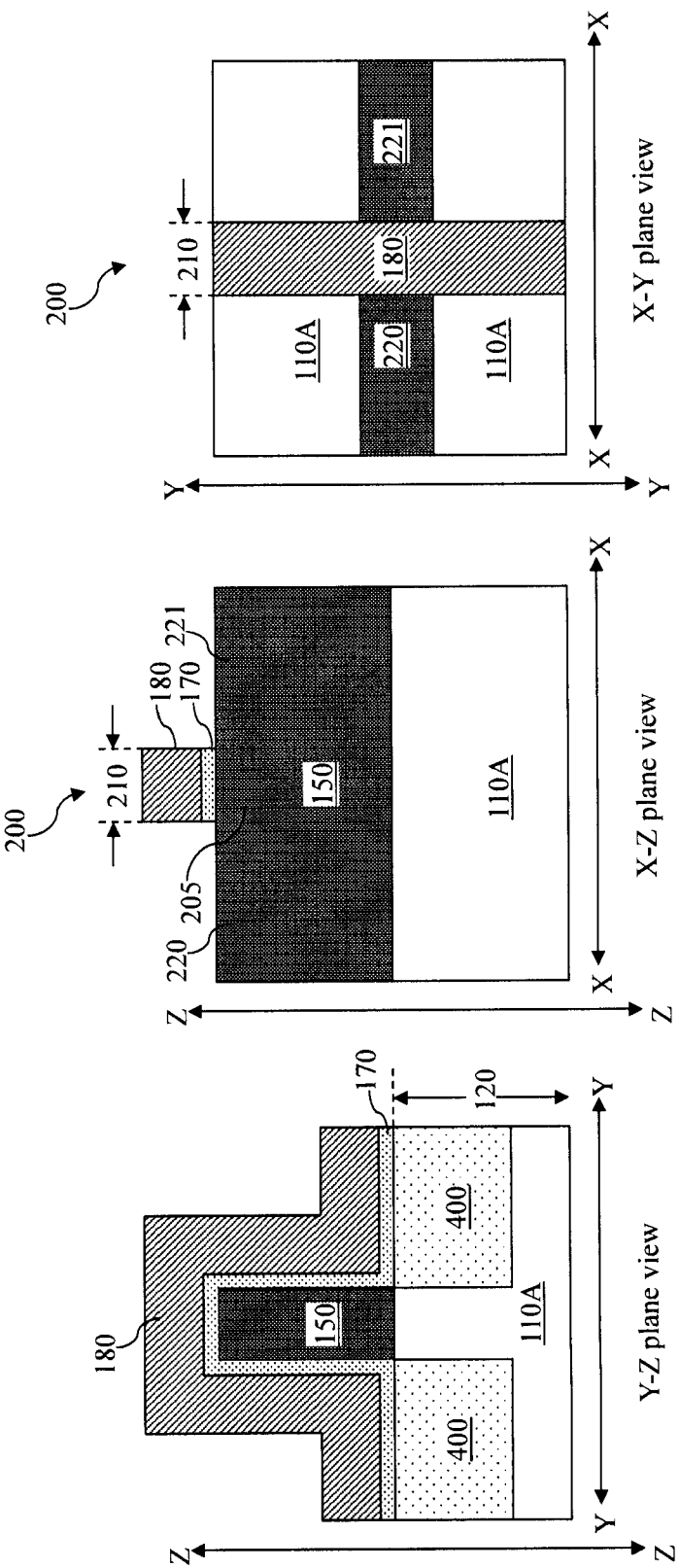

US 9,099,495 B1

FORMATION OF HIGH QUALITY FIN IN 3D STRUCTURE BY WAY OF TWO-STEP IMPLANTATION

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, it may be difficult to form a fin structure that is substantially free of defects using conventional implant methods. In many conventional FinFET devices, a twin-like defect may appear on a top of the fin structure. A hot implant process may be utilized to remove the twin-like defect. Unfortunately, the hot implant process may induce other unique defects in fin structures such as cluster defects, especially if the hot implant process is applied in low dosage situations. The hot implant process may also cause the thermal budget to be exceeded.

Therefore, while existing methods of fabricating FinFET devices have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-6A are diagrammatic fragmentary cross-sectional views of a FinFET device at different stages of fabrication in accordance with an embodiment of the present disclosure.

FIGS. 3B-6B are different diagrammatic fragmentary cross-sectional views of the FinFET device at different stages of fabrication in accordance with an embodiment of the present disclosure.

FIGS. 3C-6C are diagrammatic fragmentary top level views of the FinFET device at different stages of fabrication in accordance with an embodiment of the present disclosure.

FIGS. 10A-13A are diagrammatic fragmentary cross-sectional views of a FinFET device at different stages of fabrication in accordance with an alternative embodiment of the present disclosure.

FIGS. 10B-13B are different diagrammatic fragmentary cross-sectional views of the FinFET device at different stages of fabrication in accordance with the alternative embodiment of the present disclosure.

FIGS. 10C-13C are diagrammatic fragmentary top level views of the FinFET device at different stages of fabrication in accordance with the alternative embodiment of the present disclosure.

DETAILED DESCRIPTION

Figure 1:
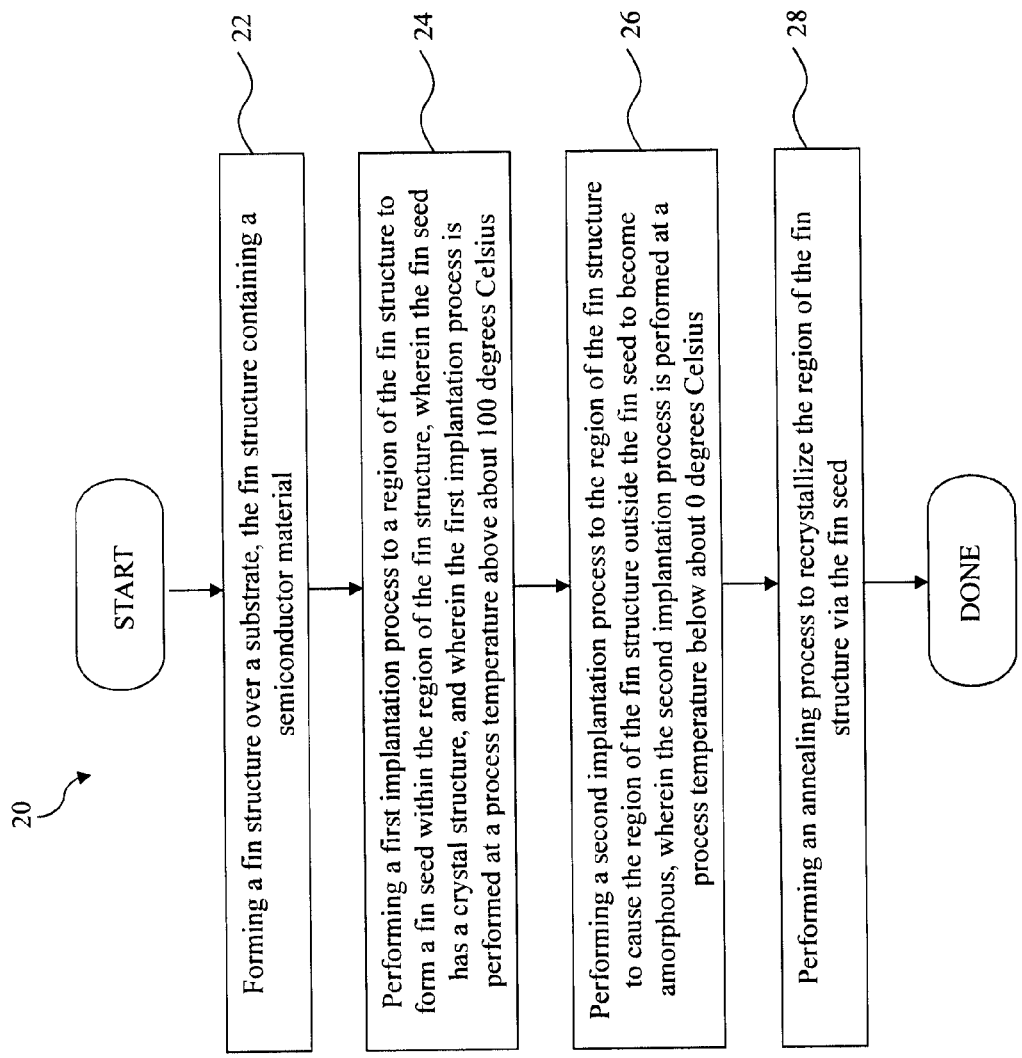
FIG. 1 is a flow chart of a method for fabricating a FinFET device in accordance with aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

FIG. 1 is a flowchart of a method 20 for fabricating a FinFET device in accordance with various aspects of the present disclosure. The method 20 includes a step 22 of forming a fin structure over a substrate. The fin structure contains a semiconductor material. In some embodiments, the forming of the fin structure includes a step of forming a semiconductor layer over the substrate and a step of patterning the semiconductor layer into the fin structure.

The method 20 includes a step 24 of performing a first implantation process to a region of the fin structure to form a fin seed within the region of the fin structure. The fin seed has a crystal structure. The first implantation process is performed at a process temperature above about 100 degrees Celsius. In some embodiments, the process temperature of the first implantation process is in a range from about 100 degrees Celsius to about 800 degrees Celsius. In some embodiments, the process temperature of the first implantation process is in a range from about 400 degrees Celsius to about 500 degrees Celsius. In some embodiments, the first implantation process is performed with an implantation dosage in a range from about 5E12 ions/centimeter$^2$ to about 1E15 ions/centimeter$^2$. In some embodiments, the first implantation process is performed using Arsenic as a dopant. In some embodiments, the first implantation process is performed at a tilted implant angle.

The method 20 includes a step 26 of performing a second implantation process to the region of the fin structure to cause the region of the fin structure outside the fin seed to become amorphous. The second implantation process is performed at a process temperature below about 0 degrees Celsius. In some embodiments, the second implantation process has a lower implantation energy than the first implantation process. In some embodiments, the process temperature of the second implantation process is in a range from about 0 degrees Celsius to about −120 degrees Celsius. In some embodiments, the process temperature of the second implantation process is in a range from about −60 degrees Celsius to about −100 degrees Celsius. In some embodiments, the second implantation process is performed with an implantation dosage in a range from about 5E12 ions/centimeter$^2$ to about 1E15 ions/centimeter$^2$. In some embodiments, an implantation dosage ratio between the first implantation process and the second implantation process is in a range from about 0.2 to about 0.8. In some embodiments, the second implantation process is performed in a manner such that the region of the fin structure is substantially devoid of a cluster of locally amorphous portions. In some embodiments, the second implantation process is performed using Arsenic as a dopant. In some embodiments, the second implantation process is performed at a tilted implant angle.

The method 20 includes a step 28 of performing an annealing process to recrystallize the region of the fin structure via the fin seed. In some embodiments, the annealing process is a spike annealing process and is performed at a process temperature in a range from about 700 degrees Celsius to about 1300 degrees Celsius. In some embodiments, a lightly-doped source/drain region is formed by the recrystallized region of the fin structure.

It is understood that additional process steps may be performed before, during, or after the steps 22-28 discussed above to complete the fabrication of the semiconductor device. For example, before the first implantation is performed, a step of forming a gate structure may be performed. The gate structure is formed to wrap around a portion of the fin structure. The region of the fin structure in which the first implantation process is performed is located adjacent to the portion of the fin structure that is being wrapped around by the gate structure. Other process steps are not discussed herein for reasons of simplicity.

Figure 2:
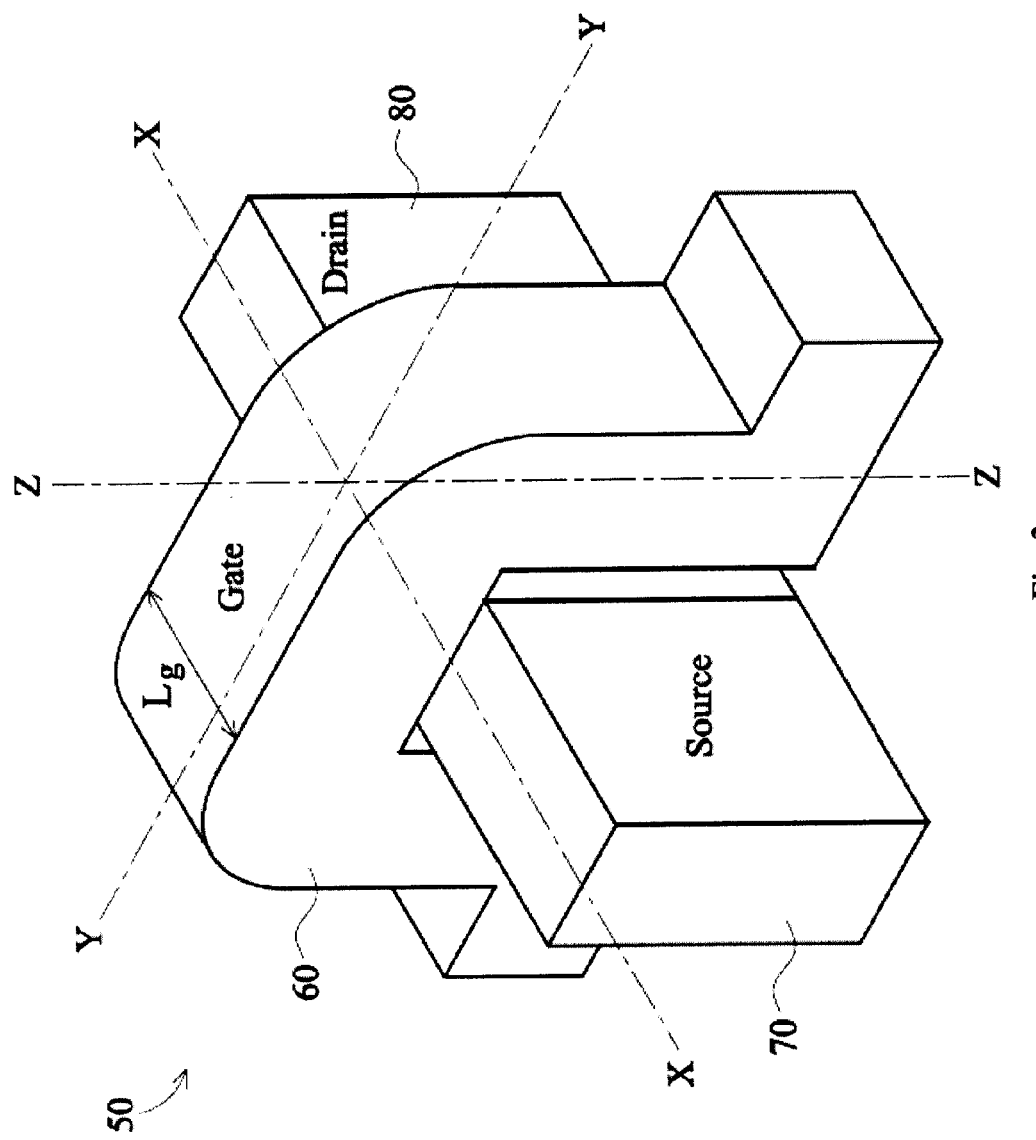
FIG. 2 is a perspective view of an example FinFET device.

The use of FinFET devices has been gaining popularity in the semiconductor industry. Referring to FIG. 2, a perspective view of an example FinFET device 50 is illustrated. The FinFET device 50 is a non-planar multi-gate transistor that is built on a substrate. A thin silicon "fin-like" structure (referred to as fin) forms the body of the FinFET device 50. A gate 60 of the FinFET device 50 is wrapped around this fin. Lg denotes a length (or width, depending on the perspective) of the gate 60. A source 70 and a drain 80 of the FinFET device 50 are formed in extensions of the fin on opposite sides of the gate 60. The fin itself serves as a channel. The effective channel length of the FinFET device 50 is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, traditional FinFET fabrication methods may still have shortcomings. For example, in many conventional FinFET devices, a twin-like defect may appear on a top of the fin structure. This may be due to naturally different re-crystallization rates on surface orientations of <100> and <110>. A hot implant process may be utilized to remove the twin-like defect. Unfortunately, the hot implant process may induce other unique defects in fin structures such as cluster defects, especially if the hot implant process is applied in low dosage situations. The hot implant process may also cause the thermal budget to be exceeded.

In comparison, the various aspects of the present disclosure involve using a two-step implant process in a low-dosage context to fabricate a FinFET device. The two-step implant process substantially eliminates the cluster defects associated with hot implants, while also allowing the thermal budget to be met, as discussed in more detail below.

The following Figures illustrate various cross-sectional views and top views of a FinFET device at different stages of fabrication. For the sake of clarity, three-dimensional axes X, Y, and Z are shown in FIG. 2 to correspond to the axes in the later Figures. The X, Y, and Z axes may also be referred to as the X, Y, and Z directions, respectively.

Referring now to FIGS. 3A, 3B, and 3C, FIG. 3A is a cross-sectional view of a FinFET device 100 taken at the Y-Z plane, FIG. 3B is a cross-sectional view of the FinFET device 100 taken at the X-Z plane, and FIG. 3C is a top view of the FinFET device 100 taken at the X-Y plane. The FinFET device 100 includes a substrate 110. In some embodiments, the substrate 110 includes a dielectric material, for example silicon oxide ($SiO_2$). The substrate 110 has a thickness 120. In an embodiment, the thickness is in a range from about 4 nanometers (nm) to about 30 nm.

A semiconductor layer 130 is formed on the substrate 110. In an embodiment, the semiconductor layer 130 includes a crystal silicon material. It is understood that the semiconductor layer 130 may include other suitable crystal materials in alternative embodiments. An implantation process 140 is performed on the semiconductor layer 130 to implant a plurality of dopant ions to the semiconductor layer 130. The dopant ions include an N-type material in an embodiment, for example arsenic (As) or phosphorous (P). After the implantation process 140 is performed, a doping concentration level is in a range from about $1 \times 10^{17}$ ions/cm$^3$ to about $5 \times 10^{19}$ ions/cm$^3$. In other embodiments, the dopant ions may include a P-type material, for example boron (B), and the doping concentration levels may be different.

Referring now to FIGS. 4A-4C, the semiconductor layer 130 is patterned to form a fin structure 150. The fin structure 150 extends in an elongate manner along the X direction, as illustrated in FIGS. 4B and 4C. As discussed previously, the fin structure 150 will serve as a conductive channel for the FinFET device 100. The fin structure 150 has a fin width 160 measured in the Y direction. In an embodiment, the fin width 160 is in a range from about 2 nm to about 15 nm.

Referring now to FIGS. 5A-5C, a gate dielectric layer 170 is formed around the fin structure 150, and a gate electrode layer 180 is formed on the gate dielectric layer 170. The gate dielectric layer 170 and the gate electrode layer 180 may each be formed using a deposition process known in the art, for example chemical vapor deposition (CVD), physical vapor deposition (PVD), atomic layer deposition (ALD), combinations thereof, or another suitable process. In an embodiment, the gate dielectric layer 170 includes a hafnium oxide ($HfO_2$) material and has a thickness (measured in the Z direction) that is in a range from about 1 nm to about 3 nm. In an embodiment, the gate electrode layer 180 includes a titanium nitride (TiN) material and has a thickness (measured in the Z direction) that is in a range from about 1 nm to about 20 nm.

Referring now to FIGS. 6A-6C, the gate electrode layer 180 and the gate dielectric layer 170 undergo a patterning process to form a gate structure 200. The gate structure 200 extends in an elongate manner along the Y direction, as illustrated in FIGS. 6A and 6C. The gate structure 200 wraps around a portion of the fin structure 150. The portion of the fin structure 150 being wrapped around by the gate structure 200 constitutes a conductive channel region 205 according to an embodiment. The gate structure 200 has a width 210 that is measured in the X direction, as illustrated in FIGS. 6A and 6C. In an embodiment, the width 210 is in a range from about 2 nm to about 15 nm.

After the gate structure 200 is formed, lightly-doped drain/source (LDD) regions 230-231 are formed in the fin structure 150. According to the various aspects of the present disclosure, the formation of the LDD regions 220-221 includes performing a two-step implantation process to implant dopant ions into portion of the fin structure 150 (the patterned-semiconductor layer 130) located on either (or opposite) side of the gate structure 200. The two-step implantation process is explained in more detail with reference to FIGS. 7-8.

Figure 7:
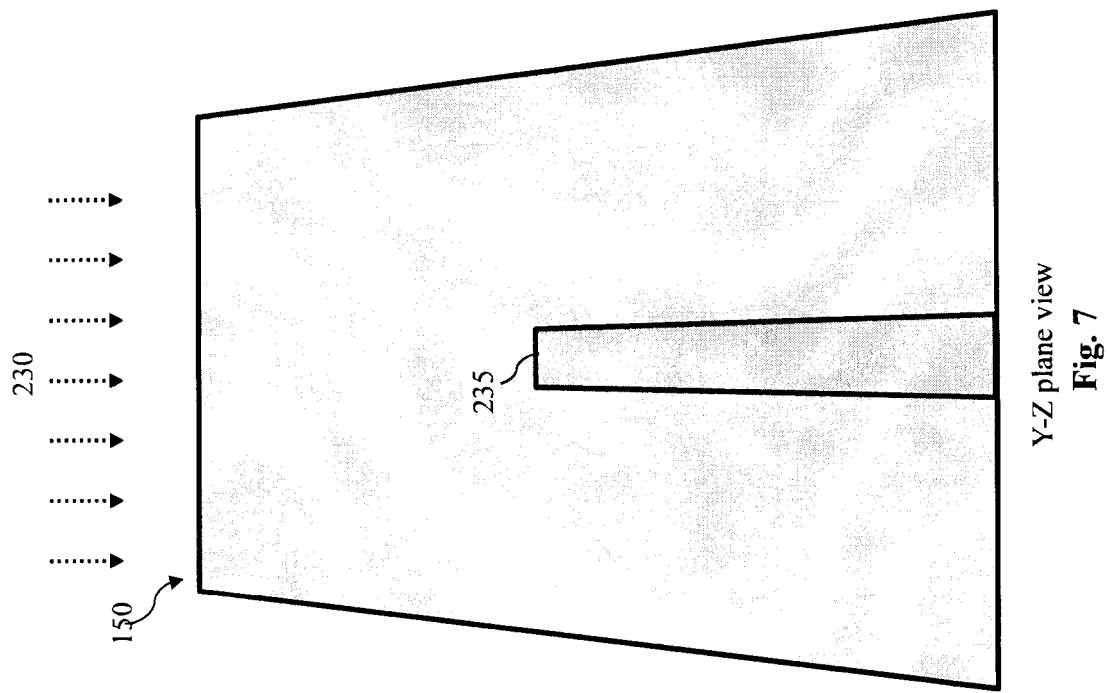
FIGS. 7-9 are diagrammatic fragmentary cross-sectional views of a fin structure of the FinFET device at different stages of fabrication in accordance with an embodiment of the present disclosure.

FIG. 7 is a more detailed view of the portion of the fin structure 150 where the LDD regions 230 or 231 are to be formed by the two-step implantation process discussed below. The portion of the fin structure 150 shown in FIG. 7 is taken across the Y-Z plane. According to the two-step implantation process of the present disclosure, a hot implantation process 230 is first performed to the fin structure 150 to form a fin seed 235. In some embodiments, the dopant ions are Arsenic ions or Boron ions, depending on whether an nFET or a pFET is to be formed. The fin seed 235 is formed to be a crystal structure to facilitate recrystallization of the fin structure 150 in later processes. To ensure that the fin seed 235 can be formed deep within the fin structure 150, the hot implantation process 230 is a deep implantation. For example, an implantation energy of the hot implantation process 230 is in a range from about 1 kilo-electron-volts (keV) to about 10 keV.

Also to ensure that the fin seed 235 can maintain its crystal quality, the hot implantation process 230 is performed at a high temperature, for example a temperature in a range from about 100 degrees Celsius to about 800 degrees Celsius. In some embodiments, the temperature is in a range from about 400 degrees Celsius to about 500 degrees Celsius. The high process temperature allows the fin seed 235 to "repair" its lattice structure even if the lattice structure is damaged or disrupted by the implant ions during the implantation process 230. In other words, the hot process temperature provides an energy boost to the crystals of the fin seed 235 such that the fin seed 235 can "heal" itself while the hot implantation process 230 takes place.

The lightly-doped nature of the LDD regions 230/231 dictate that they be formed by low-dosage implantation. For example, the hot implantation process 230 is performed with a dosage in a range from about $5 \times 10^{12}$ ions/cm$^2$ to about $1 \times 10^{15}$ ions/cm$^2$. In some embodiments, the dosage of the hot implantation process is in a range from about $1 \times 10^{14}$ ions/cm$^2$ to about $1 \times 10^{15}$ ions/cm$^2$. Note that the dosage of the hot implantation process 230 is only a partial dosage (for example about 20%-30%) of the total dosage required for the formation of the LDD regions. The dosage level of the hot implantation process 230 is limited to avoid causing serious damage to the crystal structure of the fin seed 235.

Figure 8:
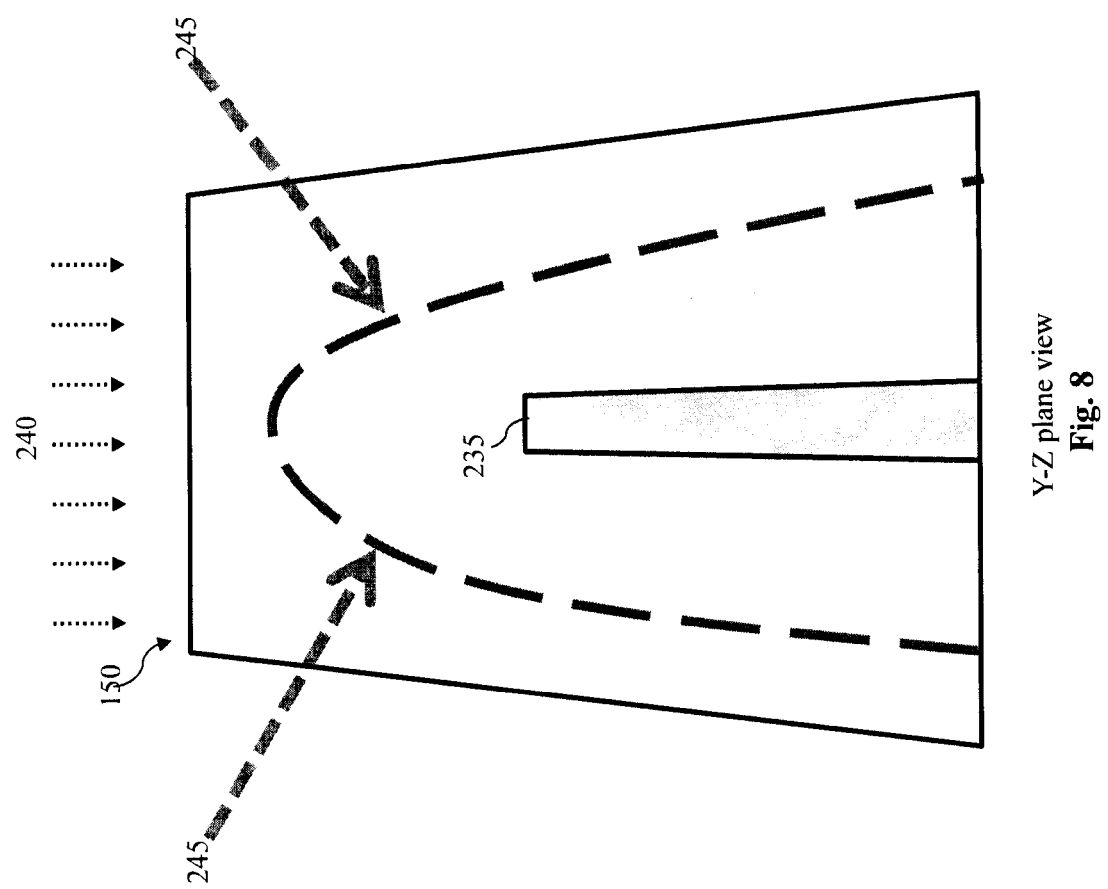

Referring now to FIG. 8, a cold implantation process 240 (also referred to as a cryo implantation process) is performed to the fin structure 150 following the hot implantation process 230 discussed above with reference to FIG. 7. In some embodiments, the dopant ions are Arsenic or Boron ions, depending on whether an nFET or a pFET is to be formed. The cold implantation process 240 is performed at a low process temperature in a range from about 0 degrees Celsius to about −120 degrees Celsius. In some embodiments, the low process temperature is in a range from about −60 degrees Celsius to about −100 degrees Celsius. It can be seen that the process temperature of the cold implantation process 240 is several hundred (e.g., 400-500) degrees (in Celsius) lower than the process temperature of the hot implantation process 230. The reasons for performing such a low temperature implant are discussed below.

As is shown in FIG. 8, the cold implantation process 240 is performed to implant dopant ions into regions 245 of the fin structure 150, which surround or outline the fin seed 235. The location of the region 245 may be tuned by adjusting an implantation energy of the cold implantation process 240, which is in a range from about 0.5 keV to about 10 keV in the embodiment illustrated herein. It is understood that in any particular embodiment, the implantation energy of the cold implantation process 240 should be lower than the implantation energy of the hot implantation process 230, even though their implantation energy ranges may partially overlap across different embodiments. It is understood that the implanted dopant ions may diffuse both inward (i.e., away from a surface of the fin structure 150) and outward (i.e., toward the surface of the fin structure 150) from the regions 245. The dopant ion diffusion may follow a Gaussian distribution, for example.

The cold implantation process 240 is also performed with a substantially higher dosage than the hot implantation process 230. For example, the dosage of the cold implantation process 240 may constitute about 70%-80% of the total dosage required for the formation of the LDD regions. In some embodiments, a dosage ratio between the hot implantation process 230 to the cold implantation process 240 is in a range from about 0.2 to about 0.8, that is, a number of dopant ions implanted in the hot implantation process 230 is about 20% to about 80% of the number of dopant ions implanted in the cold implantation process 240. In some embodiments, the dosage of the cold implantation process 240 is in a range from about $2 \times 10^{13}$ ions/cm$^2$ to about $4 \times 10^{15}$ ions/cm$^2$. In some other embodiments, the dosage of the cold implantation process 240 is in a range from about $4 \times 10^{14}$ ions/cm$^2$ to about $4 \times 10^{15}$ ions/cm$^2$. The relatively high dosage of the cold implantation process 240 helps break up the crystal lattice of the fin structure 150, thereby forming amorphous silicon regions in the fin structure 150.

The cold process temperatures of the cold implantation process 240 further facilitates the forming of the amorphous silicon regions in the fin structure 150. For example, the cold process temperatures deprive the broken lattice structures of the re-activation energy required to reform the crystal lattice. Thus, the cold implantation process 240 causes the fin structure 150 (except the fin seed 235) to be fully amorphous, especially the surface portions of the fin structure 150. The fact that the fin structure 150 is now globally amorphous means that a good crystal structure can be achieved for the fin structure 150 in a later recrystallization process.

In comparison, conventional processes may lead to a fin structure that is partially amorphous or only has a plurality of locally amorphous regions. In those situations, the recrystallization of the fin structure will likely lead to a cluster of locally recrystallized portions, instead of a fully recrystallized fin structure in its entirety, whereas a fully recrystallized fin structure can be achieved for the present disclosure. In other words, the present disclosure creates a globally amorphous fin structure by performing a hot implantation process with a lower dosage followed by a cryo implantation process with a higher dosage and a lower implant energy. The globally amorphous fin structure leads to better recrystallization and reduction of cluster defects. In addition, the two-step implantation process discussed herein also allows for a desired thermal budget to be met, since a hot temperature need not be maintained for a long period of time. It is understood that the implantation time or duration for the hot or cold implantation processes discussed above will depend on the dosage and the beam current and thus may not be a precise constant value. In some embodiments, however, the implantation time or duration may be in a range from about 12 seconds to about 20 seconds, though other values are possible in different embodiments. As for the time duration for the annealing process (e.g., spike annealing) discussed above, it may be dependent on the different types of tools used. In some embodiments, the annealing process duration may be in a range from about 60 seconds to about 68 seconds, though other values are possible in different embodiments.

It is also understood that the hot implantation process 230 and the cold implantation process 240 discussed above may be performed at tiled implant angles. For example, the amount of implant tilt angle may be collocated with the fin structure and its dimensions.

Figure 9:
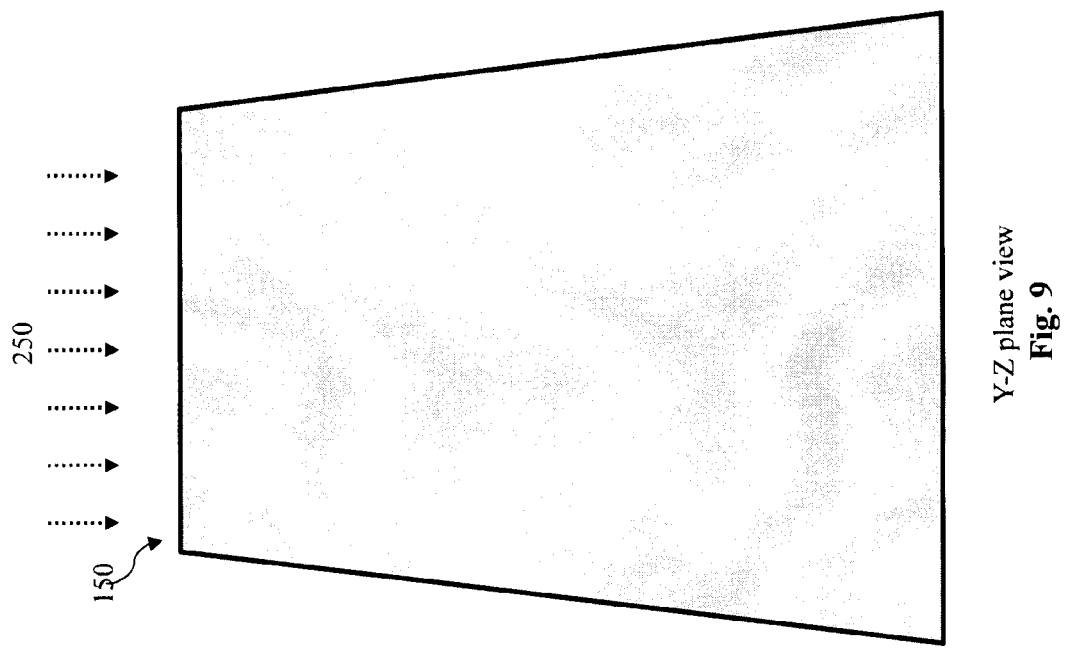

Referring now to FIG. 9, the recrystallization of the fin structure 150 discussed above is performed via an annealing process 250. In some embodiments, the annealing process 250 includes a spike annealing process. The spike annealing process may be performed at a temperature in a range from about 700 degrees Celsius to about 1300 degrees Celsius, for example around 950 degrees Celsius. The fin seed 235 provides the crystal structure, and the hot annealing temperature provides the reactivation energy to reform the crystal lattice of the fin structure 150. Again, since the fin structure 150 does not contain a plurality of locally amorphous regions, the whole fin structure 150 may be recrystallized into a single crystal structure, rather than a cluster of locally crystalized portions.

It is understood that the processes discussed herein pertains to a low dosage implant context, though it is not necessarily limited to the formation of LDD regions. For high dosage implant processes, the high implant dosage would likely cause the implanted region to be fully amorphous anyway, and therefore the processes discussed herein to create an implanted device with the fully amorphous state may not be needed. Stated differently, the problems associated with conventional low dosage implantation processes may not have been a problem in the first place for high dosage implantation processes, as such, the present disclosure may not be needed in high implant dosage contexts. However, for low dosage implant contexts, the present disclosure offers a solution to reduce defects while meeting a desired thermal budget.

Additional processes may be performed to complete the fabrication of the FinFET but are not discussed herein in detail for reasons of simplicity. For example, these additional fabrication processes may involve the formation of gate spacers, heavily doped source and drain regions, interconnect structures, etc. Furthermore, FIGS. 3A-3C to FIGS. 6A-6C illustrate a process flow of fabricating a FinFET device according to a silicon-on-insulator (SOI) approach. FIGS. 10A-10C to FIGS. 13A-13C illustrate various cross-sectional views and top views of a FinFET device 100A fabricated according to an alternative embodiment involving using a bulk instead of the SOI approach. For the sake of consistency and clarity, components that are similar to the ones appearing in FIGS. 3A-3C to FIGS. 6A-6C are labeled the same in FIGS. 10A-10C to FIGS. 13A-13C.

Referring to FIGS. 10A-10C, the semiconductor layer 130 is formed on the substrate 110. Here, instead of including a dielectric material, the substrate 110A includes a doped-silicon material, for example a P-type doped silicon material. The type of conductivity of the substrate 110A is opposite than that of the semiconductor layer 130. The substrate 110A is a p-type substrate for an n-FET device, and the substrate 110A is an n-type substrate for a p-FET device.

Figure 11C:
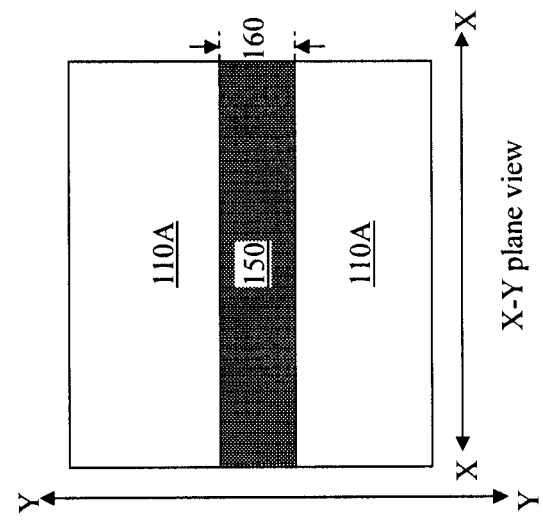
Figure 11B:
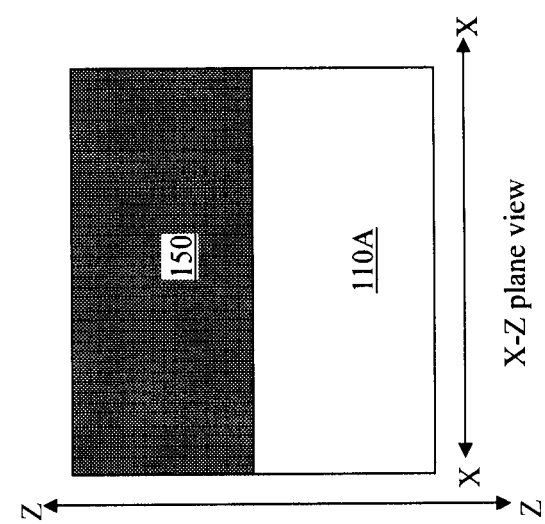
Figure 11A:
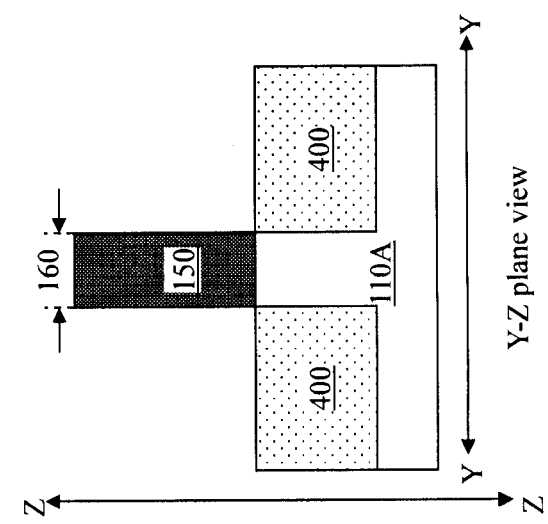

Referring now to FIGS. 11A-11C, the semiconductor layer 130 is patterned into the elongate fin structure 150. Unlike the previous embodiment shown in FIG. 4, the patterning process also removes a portion of the substrate 110A, as is illustrated in FIG. 11A. Thereafter, an insulating material 400 is formed in place of the removed-portions of the substrate 110A on either side of the fin structure 150. The insulating material 400 may include a dielectric material, for example a silicon oxide material.

Referring now to FIGS. 12A-12C, the gate electrode layer 180 and the gate dielectric layer 170 are formed over the fin structure 150. Referring now to FIGS. 13A-13C, the gate electrode layer 180 and the gate dielectric layer 170 are patterned to form the gate structure 200. The gate structure 200 wraps around the fin structure 150. After the gate structure 200 is formed, the two-step implantation process discussed above with reference to FIGS. 7-9 may be performed to form the LDD regions. Again, the fin structure for the LDD regions can achieve high crystal quality due to the globally amorphous state of the fin structure prior to recrystallization. The cluster defects associated with conventional devices are substantially reduced or eliminated.

One aspect of the present disclosure involves a method of fabricating a semiconductor device. The method includes: forming a fin structure over a substrate, the fin structure containing a semiconductor material; performing a first implantation process to a region of the fin structure to form a fin seed within the region of the fin structure, wherein the fin seed has a crystal structure, and wherein the first implantation process is performed at a process temperature above about 100 degrees Celsius; performing a second implantation process to the region of the fin structure to cause the region of the fin structure outside the fin seed to become amorphous, wherein the second implantation process is performed at a process temperature below about 0 degrees Celsius; and thereafter performing an annealing process to recrystallize the region of the fin structure via the fin seed.

In some embodiments, the forming of the fin structure comprises: forming a semiconductor layer over the substrate; and patterning the semiconductor layer into the fin structure.

In some embodiments, the method further includes a step of: before the performing of the first implantation process, forming a gate structure that wraps around a portion of the fin structure;

In some embodiments, the region of the fin structure in which the first implantation process is performed is located adjacent to the portion of the fin structure that is being wrapped around by the gate structure.

In some embodiments, the second implantation process has a lower implantation energy than the first implantation process.

In some embodiments, the process temperature of the first implantation process is in a range from about 100 degrees Celsius to about 800 degrees Celsius; and the process temperature of the second implantation process is in a range from about 0 degrees Celsius to about −120 degrees Celsius.

In some embodiments, the process temperature of the first implantation process is in a range from about 400 degrees Celsius to about 500 degrees Celsius; and the process temperature of the second implantation process is in a range from about −60 degrees Celsius to about −100 degrees Celsius.

In some embodiments, the first implantation process and the second implantation process are each performed with an implantation dosage in a range from about 5E12 ions/centimeter2 to about 1E15 ions/centimeter2. In some embodiments, an implantation dosage ratio between the first implantation process and the second implantation process is in a range from about 0.2 to about 0.8.

In some embodiments, the second implantation process is performed in a manner such that the region of the fin structure is substantially devoid of a cluster of locally amorphous portions.

In some embodiments, the annealing process is a spike annealing process and is performed at a process temperature in a range from about 700 degrees Celsius to about 1300 degrees Celsius.

In some embodiments, at least one of the first and second implantation processes is performed at a tilted implant angle.

In some embodiments, a lightly-doped source/drain region is formed by the recrystallized region of the fin structure.

In some embodiments, the first and second implantation processes are performed using Arsenic as a dopant.

Another aspect of the present disclosure involves a method of fabricating a semiconductor device. The method includes: forming a fin structure over a substrate, the fin structure containing a semiconductor material; forming, via a heated implantation process, a fin seed in the fin structure, the fin seed having a crystal structure, wherein the heated implantation process has a process temperature in a range from about 100 degrees Celsius to about 800 degrees Celsius; forming, via a cryo implantation process, a globally amorphous layer in the fin structure outside the fin seed, wherein the cryo implantation process has a process temperature in a range from about 0 degrees Celsius to about −120 degrees Celsius, wherein the cryo implantation process is performed using a lower implantation energy and a higher dosage than the heated implantation process; and recrystallizing the globally amorphous layer of the fin structure via an annealing process that has a process temperature in a range from about 700 degrees Celsius to about 1300 degrees Celsius.

In some embodiments, the method further includes: before the performing of the first implantation process, forming a gate structure that wraps around a first portion of the fin structure, and wherein the heated implantation process, the cryo implantation process, and the annealing process are performed to a second portion of the fin structure to form a lightly-doped source/drain in the second portion of the fin structure, the second portion of the fin structure not being wrapped around by the gate structure.

In some embodiments, the semiconductor material is silicon; and the heated implantation process and the cryo implantation process are performed using tilted implant angles and with Arsenic as a dopant species.

In some embodiments, the process temperature of the heated implantation process is in a range from about 400 degrees Celsius to about 500 degrees Celsius; the process temperature of the cryo implantation process is in a range from about −60 degrees Celsius to about −100 degrees Celsius; the heated implantation process and the cryo implantation process are each performed with an implantation dosage in a range from about 5E12 ions/centimeter2 to about 1E15 ions/centimeter2; and an implantation dosage ratio between the heated implantation process and the cryo implantation process is in a range from about 0.2 to about 0.8.

Yet another aspect of the present disclosure involves a method of fabricating a semiconductor device. The method includes: forming a silicon layer over a substrate; patterning the silicon layer into a fin structure; forming a gate structure that wraps around a first portion of the fin structure; performing a hot implantation process to a second portion of the fin structure that is not wrapped around by the gate structure, thereby forming a fin seed having a crystal structure, wherein a process temperature of the hot implantation process is in a range from about 400 degrees Celsius to about 500 degrees Celsius; performing a cold implantation process to the second portion of the fin structure to form an amorphous layer that surrounds the fin seed, the amorphous layer being substantially devoid of a plurality of locally amorphous portions, wherein a process temperature of the cold implantation process is in a range from about −60 degrees Celsius to about −100 degrees Celsius, and wherein the cold implantation process is performed using a lower implantation energy and a higher dosage than the hot implantation process; and performing a spike annealing process to recrystallize the amorphous layer, thereby forming a lightly-doped source/drain in the second portion of the fin structure, wherein a process temperature of the spike annealing process is in a range from about 700 degrees Celsius to about 1300 degrees Celsius.

In some embodiments, the hot implantation process and the cold implantation process are performed using Arsenic as a dopant and with an implantation dosage in a range from about 5E12 ions/centimeter2 to about 1E15 ions/centimeter2, and wherein a first number of dopant ions implanted in the hot implantation process is in a range from about 20% to about 80% of a second number of dopant ions implanted in the cold implantation process.

In some embodiments, the hot implantation process and the cold implantation process are each performed at a tilted implant angle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a fin structure over a substrate, the fin structure containing a semiconductor material;
    performing a first implantation process to a region of the fin structure to form a fin seed within the region of the fin structure, wherein the fin seed has a crystal structure, and wherein the first implantation process is performed at a process temperature above about 100 degrees Celsius;
    performing a second implantation process to the region of the fin structure to cause the region of the fin structure outside the fin seed to become amorphous, wherein the second implantation process is performed at a process temperature below about 0 degrees Celsius; and
    thereafter performing an annealing process to recrystallize the region of the fin structure via the fin seed.

2. The method of claim 1, wherein the forming of the fin structure comprises:
    forming a semiconductor layer over the substrate; and
    patterning the semiconductor layer into the fin structure.

3. The method of claim 1, further comprising:
    before the performing of the first implantation process, forming a gate structure that wraps around a portion of the fin structure;
    wherein the region of the fin structure in which the first implantation process is performed is located adjacent to the portion of the fin structure that is being wrapped around by the gate structure.

4. The method of claim 1, wherein the second implantation process has a lower implantation energy than the first implantation process.

5. The method of claim 1, wherein:
the process temperature of the first implantation process is in a range from about 100 degrees Celsius to about 800 degrees Celsius; and
the process temperature of the second implantation process is in a range from about 0 degrees Celsius to about −120 degrees Celsius.

6. The method of claim 5, wherein:
the process temperature of the first implantation process is in a range from about 400 degrees Celsius to about 500 degrees Celsius; and
the process temperature of the second implantation process is in a range from about −60 degrees Celsius to about −100 degrees Celsius.

7. The method of claim 1, wherein the first implantation process and the second implantation process are each performed with an implantation dosage in a range from about 5E12 ions/centimeter$^2$ to about 1E15 ions/centimeter$^2$.

8. The method of claim 7, wherein an implantation dosage ratio between the first implantation process and the second implantation process is in a range from about 0.2 to about 0.8.

9. The method of claim 1, wherein the second implantation process is performed in a manner such that the region of the fin structure is substantially devoid of a cluster of locally amorphous portions.

10. The method of claim 1, wherein the annealing process is a spike annealing process and is performed at a process temperature in a range from about 700 degrees Celsius to about 1300 degrees Celsius.

11. The method of claim 1, wherein at least one of the first and second implantation processes is performed at a tilted implant angle.

12. The method of claim 1, wherein a lightly-doped source/drain region is formed by the recrystallized region of the fin structure.

13. The method of claim 1, wherein the first and second implantation processes are performed using Arsenic as a dopant.

14. A method of fabricating a semiconductor device, comprising:
forming a fin structure over a substrate, the fin structure containing a semiconductor material;
forming, via a heated implantation process, a fin seed in the fin structure, the fin seed having a crystal structure, wherein the heated implantation process has a process temperature in a range from about 100 degrees Celsius to about 800 degrees Celsius;
forming, via a cryo implantation process, a globally amorphous layer in the fin structure outside the fin seed, wherein the cryo implantation process has a process temperature in a range from about 0 degrees Celsius to about −120 degrees Celsius, wherein the cryo implantation process is performed using a lower implantation energy and a higher dosage than the heated implantation process; and
recrystallizing the globally amorphous layer of the fin structure via an annealing process that has a process temperature in a range from about 700 degrees Celsius to about 1300 degrees Celsius.

15. The method of claim 14, further comprising: before the performing of the first implantation process, forming a gate structure that wraps around a first portion of the fin structure, and wherein the heated implantation process, the cryo implantation process, and the annealing process are performed to a second portion of the fin structure to form a lightly-doped source/drain in the second portion of the fin structure, the second portion of the fin structure not being wrapped around by the gate structure.

16. The method of claim 14, wherein:
the semiconductor material is silicon; and
the heated implantation process and the cryo implantation process are performed using tilted implant angles and with Arsenic as a dopant species.

17. The method of claim 14, wherein:
the process temperature of the heated implantation process is in a range from about 400 degrees Celsius to about 500 degrees Celsius;
the process temperature of the cryo implantation process is in a range from about −60 degrees Celsius to about −100 degrees Celsius;
the heated implantation process and the cryo implantation process are each performed with an implantation dosage in a range from about 5E12 ions/centimeter$^2$ to about 1E15 ions/centimeter$^2$; and
an implantation dosage ratio between the heated implantation process and the cryo implantation process is in a range from about 0.2 to about 0.8.

18. A method of fabricating a semiconductor device, comprising:
forming a silicon layer over a substrate;
patterning the silicon layer into a fin structure;
forming a gate structure that wraps around a first portion of the fin structure;
performing a hot implantation process to a second portion of the fin structure that is not wrapped around by the gate structure, thereby forming a fin seed having a crystal structure, wherein a process temperature of the hot implantation process is in a range from about 400 degrees Celsius to about 500 degrees Celsius;
performing a cold implantation process to the second portion of the fin structure to form an amorphous layer that surrounds the fin seed, the amorphous layer being substantially devoid of a plurality of locally amorphous portions, wherein a process temperature of the cold implantation process is in a range from about −60 degrees Celsius to about −100 degrees Celsius, and wherein the cold implantation process is performed using a lower implantation energy and a higher dosage than the hot implantation process; and
performing a spike annealing process to recrystallize the amorphous layer, thereby forming a lightly-doped source/drain in the second portion of the fin structure, wherein a process temperature of the spike annealing process is in a range from about 700 degrees Celsius to about 1300 degrees Celsius.

19. The method of claim 18, wherein the hot implantation process and the cold implantation process are performed using Arsenic as a dopant and with an implantation dosage in a range from about 5E12 ions/centimeter$^2$ to about 1E15 ions/centimeter$^2$, and wherein a first number of dopant ions implanted in the hot implantation process is in a range from about 20% to about 80% of a second number of dopant ions implanted in the cold implantation process.

20. The method of claim 18, wherein the hot implantation process and the cold implantation process are each performed at a tilted implant angle.

* * * * *